United States Patent [19]

Tsodikov

[11] Patent Number: 5,739,601
[45] Date of Patent: Apr. 14, 1998

[54] MAGNETO-MECHANICAL CONVERTER

[75] Inventor: Sergei F. Tsodikov, Moscow, Russian Federation

[73] Assignee: Magneto Corporation, New York, N.Y.

[21] Appl. No.: 640,889

[22] PCT Filed: Nov. 3, 1994

[86] PCT No.: PCT/RU94/00249

§ 371 Date: May 10, 1996

§ 102(e) Date: May 10, 1996

[87] PCT Pub. No.: WO95/13649

PCT Pub. Date: May 18, 1995

[30] Foreign Application Priority Data

Nov. 11, 1993 [RU] Russian Federation .......... 93050005

[51] Int. Cl.$^6$ .................................................. H01L 41/06
[52] U.S. Cl. .................................................. 310/26
[58] Field of Search ........................ 310/26; 318/118

[56] References Cited

U.S. PATENT DOCUMENTS

| Re. 28,381 | 4/1975 | Edson | 318/118 |
|---|---|---|---|
| 4,766,357 | 8/1988 | Glomb, Jr. | 318/118 |
| 5,184,037 | 2/1993 | Kobayashi et al. | 310/26 |

FOREIGN PATENT DOCUMENTS

| 0251468 | 1/1988 | European Pat. Off. |
| 2637746 | 4/1990 | France |
| 663337 | 5/1979 | U.S.S.R. |
| WO88/05618 | 7/1988 | WIPO |

*Primary Examiner*—Clayton E. LaBalle
*Attorney, Agent, or Firm*—Fish & Neave; Jeffrey H. Ingerman

[57] ABSTRACT

The proposed magneto-mechanical converter comprises a magnet system (2) and a core (3) at least one part (34, 36) of which is made of a magneto-strictive material. The magnet system (2) comprises a main magnetic field source (4) which in the example shown can be mounted on the magnetic circuit (21). The main magnetic field source is a permanent magnet (5). The magnet system (2) is mounted in the housing (1) in such a way that it can rotate about the core (3). The geometrical axis (15) of relative rotation of the core (3) and magnet system (2) is oriented in such a way that, during the relative rotation referred to, the magnetic flux in the magneto-strictive parts (34, 36) of the core alters and in turn causes changes in the linear dimensions of the core (3). In the example shown, the magnet system (2) includes an auxiliary magnetic field source (22) in the form of a permanent magnet (5') mounted on the magnetic circuit (33). The magnetic field sources (4, 22) consist of pairs of magnetic components (23, 24, and 25, 26). The core (3) in the example shown consists of three sections (34, 35, 36), the outer sections (34, 36) being made of magneto-strictive material. In the example shown, one (e.g. auxiliary magnetic field source (22) is mounted immovably in relation to the core (3), while a second (e.g. main) magnetic field source (4) rotates about the stationary core (3).

14 Claims, 12 Drawing Sheets

MAGNETO-MECHANICAL CONVERTER

FIELD OF THE INVENTION

The present invention relates to electrotechnology and means of automation and can be used as a device for adjustable displacements of objects, primarily for precise positioning of the actuators of machines and mechanisms.

PRIOR ART

Magneto-mechanical converters with an electromagnetic system, containing an excitation coil, serving as a magnetic field source, and a magnetostrictive core, made of a rare-earth metal-iron alloy, are known (Research of highly magnetostrictive materials on the basis of rare-earth metals (REM), report of the Physical Faculty of MGU (Moscow State University), Subject 46/75, 1977, Moscow, p. 3). The magnitude of displacements of the mobile part of the referred to magneto-mechanical converter is relatively small. Besides, the use of the magnetic field source in the form of an electric excitation coil requires significant energy consumption, in order to maintain the specified parameters of the magnetic field in the process of operation, which complicates the use of the converter as a positioner or vibrator.

A magneto-mechanical converter with a magnet system, including a magnetic field source in the form of an electric excitation coil, and a core at least one part of which is made of a magnetostrictive material, and that is connected with an actuator movable relative to the housing, is also known (SU, Author Certificate No. 765913).

Main drawbacks of the known magneto-mechanical converters include high energy consumption of the magnetic field source, which typically is implemented in the form of an electric excitation coil, due to the fact that in order to maintain the necessary parameters of the magnetic field while setting and keeping unchanged the specified linear dimensions of the core it is required to continuously supply current through the excitation coil of the magnetic field source. And what is more, for the referred to known technical solution, an additional heating of the magnet system and material of the core usually occurs, which results in the necessity of creating a complicated system of cooling and compensation of temperature changes of the linear dimensions of the core. The aforementioned drawbacks are the cause of increase of the device volume and mass on the whole, and as a result the known magneto-mechanical converters do not provide sufficient accuracy in systems for precise positioning. In addition, high energy consumption complicates the use of the converter as a vibrator.

SUMMARY OF THE INVENTION

It is an object of this invention to design a magneto-mechanical converter, that would allow decrease of power consumption and the magneto-mechanical converter volume and mass with a simultaneous increase of the range and discreteness of changes of the linear dimensions of the core, as well as provide possibilities for the converter to work as a vibrator.

It is achieved by the fact that, in the magneto-mechanical converter, comprising a main magnetic field source, and a core with at least one part made of a magnetostrictive material, connected with the actuator, which is movable relative to the housing, according to the invention, the main magnetic field source is a permanent magnet, the core and the magnet system are mounted in the housing with the capability of relative rotation, where the axis of relative rotation of the core and the magnet system is oriented in such a way that linear dimensions of the core change in the process of the above-mentioned relative rotation due to the alteration of the magnetic flux in the core.

It is desirable to place the core in the designed position in such a way that the geometrical center of at least one of its parts, made of a magnetostrictive material, is in one of the zones of the magnet system which corresponds the maximum of intensity of the magnetic field of this system.

It is further desirable to orient the axis of relative rotation of the core and the magnet system nonparallel with the vector of intensity of the magnet system magnetic field in the geometrical center of at least one part of the core, made of a magnetostrictive material, located in the designed position, and/or toward the geometrical axis, of at least one part of the core, made of a magnetostrictive material, oriented along the direction of the displacement of the actuator and passing through the geometrical center of the mentioned part made of a magnetostrictive material.

In some cases it is advantageous to have the axis of relative rotation of the core and of the magnet system passing through the geometrical center of at least one part of the core made of a magnetostrictive material.

As the optimum, the axis of relative rotation of the core and the magnet system should be positioned perpendicularly towards the mentioned geometrical axis of at least one part of the core, made of a magnetostrictive material, passing through the geometrical center of the mentioned part along the direction of the displacement of the actuator, and towards the vector of intensity of the magnet system magnetic field in the geometrical center of at least one part of the core, made of a magnetostrictive material, located in the designed position.

It is quite reasonable that the permanent magnet, serving as the main magnetic field source comprises at least two magnetic parts, that form a group and are located in one plane in such a way that the vectors of magnetization of at least two adjacent magnetic parts are oriented in opposite directions.

It is further advisable to have a magnet system, containing an auxiliary magnetic field source in the form of a permanent magnet, which would comprise at least two magnetic parts that form a group, and are located in one plane, so that the vectors of magnetization of at least two adjacent magnetic parts are oriented in opposite directions, where both magnetic field sources should be positioned mirror-symmetrically in relation to the plane located perpendicularly towards the axis of relative rotation of the core and the magnet system, and the groups of magnetic parts should be oriented in such a way that the vectors of magnetization of the oppositely located parts of the mentioned magnetic field sources are oriented along the axis of relative rotation of the core and the magnet system in opposite directions.

The core can comprise three parts, which are consecutively located along the geometrical axis of at least one part of the core, made of a magnetostrictive material, which passes through the geometrical center of this part along the direction of displacement of the actuator, where the outer parts of the core are made of a magnetostrictive material, and its middle part is made of a material with a modulus and an elastic limit, that are no less than the modulus and elastic limit of the material of any adjacent outer part, respectively.

It is possible for the material of one outer part of the core to have a positive magnetostriction, and for the material of the other outer part of the core to have a negative magnetostriction.

It is desirable to have a core, comprising two identical parallelly located parts, made of a magnetostrictive material, and it is reasonable to place the mentioned parts centrally symmetrically in relation to the geometrical axis of relative rotation of the core and the magnet system.

It is quite reasonable to have groups of magnetic parts, serving as magnetic field sources, implemented in the form of disks, and magnetic parts in the groups implemented in the form of sectors.

It is desirable to have a magnet system supplied with a magnetic circuit, and to have a magnetic field source located on the magnetic circuit on the side facing the core.

It is further reasonable to have the axis of the easiest direction of magnetization of the material of at least one part of the core, made of a magnetostrictive material, coincident with the direction of the geometrical axis of at least one part of the core, made of a magnetostrictive material, passing through the geometrical center of the mentioned part along the direction of the displacement of the actuator.

BRIEF DESCRIPTION OF THE DRAWINGS

The invention will now be explained in greater detail with reference to embodiments which are represented in the accompanying drawings, wherein.

PREFERRED EMBODIMENTS OF THE INVENTION

Figure 1:
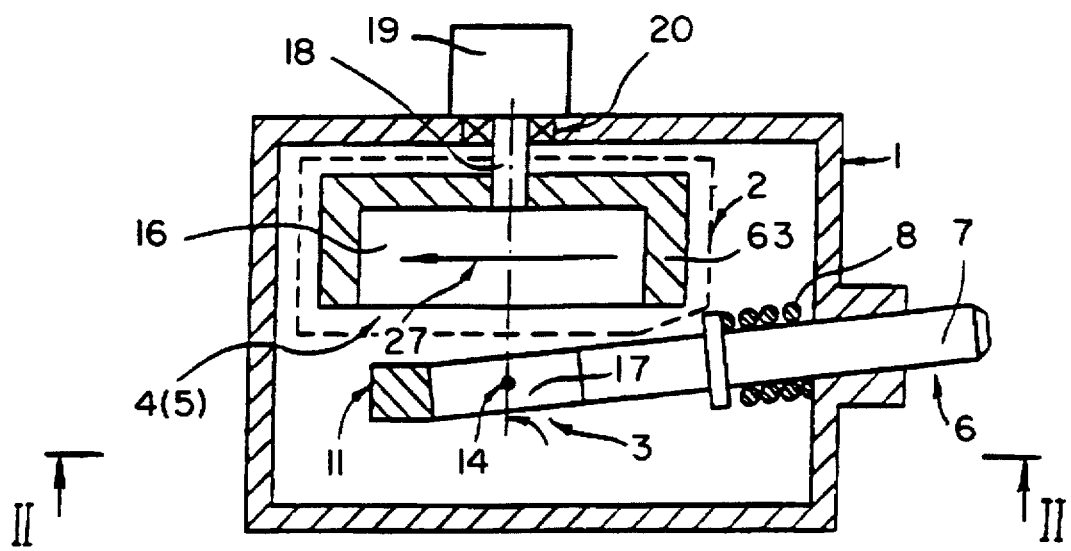
FIG. 1—depicts a general diagram of the magneto-mechanical converter of the present invention with a magnet system, including one main magnetic field source, comprising a single magnetic part, and a core, comprising a single magnetic part, made of a magnetostrictive material, the geometrical center of the core part is located on the geometrical axis of relative rotation, oriented nonparallel (at a certain angle not equal to 0°) in relation to the vector of intensity of the magnet system magnetic field and to the geometrical axis of the core part, made of a magnetostrictive material.
Figure 2:
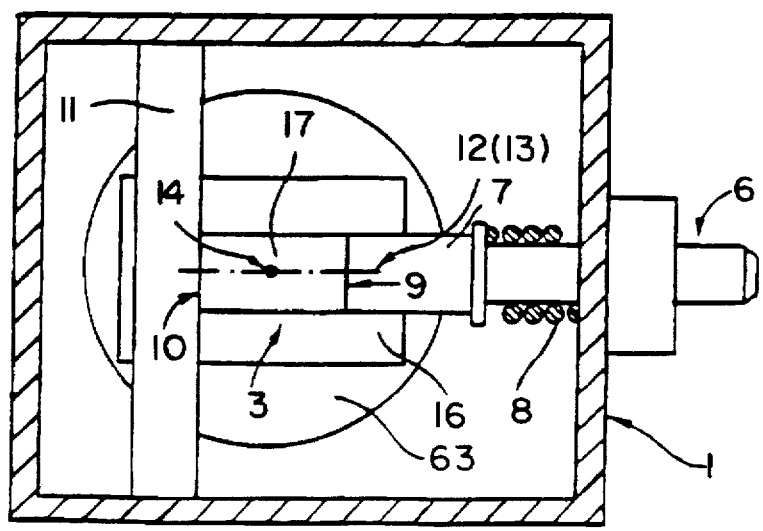
FIG. 2—section along the line II—II of FIG. 1.

The magneto-mechanical converter (FIG. 1, or 6, or 11, or 16, or 21 or 26) according to the invention comprises the housing 1, in which a magnet system 2 and a core 3 (made, e.g., of alloys $TbFe_2$, and/or $SmFe_2$, with giant magnetostriction) are mounted.

The magnet system necessarily includes the main magnetic field source 4 in the form of a permanent magnet 5. The core 3 is positioned with the minimal technologically admissible gap relative to the main magnetic field source 4. The mentioned technological gap ensures free rotation of the main magnetic field source 4(i.e., without any friction on the corresponding surface of the core 3).

Further, the magneto-mechanical converter comprises an actuator 6, made, e.g., in the form of a pusher 7, which has the capability of reciprocating displacement due to the availability of an elastic component 8 and the kinematic connection with the butt-end 9 of the core 3 turned towards the mentioned pusher 7. The opposite (relative to the mentioned butt-end 9) butt-ends 10 of the core 3 is fixed firmly relative to the housing 1 e.g., on the support made of a non-magnetic material.

The geometrical axis 12 of symmetry of at least one part of the core 3, made of a magnetostrictive material, is oriented along the direction of the displacement of the actuator 6 and mainly coincides with the direction of the axis 13 of the easiest direction of magnetization of the magnetostrictive material of the core 3 (in FIG. 2, or 7, or 12, or 17, or 22 or 27 the geometrical axis 12 and axis 13 of the easiest direction of magnetization are co-located and are shown by a dot-and-dash line).

The core 3 in the designed position is located in such a way that the geometrical center 14, of at least one of its parts, made of a magnetostrictive material, is in one of the zones of the magnet system 2, and the zone corresponds to the maximum of intensity of the magnetic field of the magnet system 2.

The core 3 and the magnet system 2 are mounted in the housing 1 with the capability of relative rotation (generally the magnet system 2 rotates, and the core 3 is stationary). The axis of relative rotation of the core 3 and the magnet system 2 is oriented nonparallel (i.e., at an angle, different from 0°, in FIG. 1 and at an angle, equal to 90°, in FIGS. 6, 11, 16, 21 and 26 in the various embodiments) in relation to the vector of intensity of the magnetic field of the magnet system 2 in the geometrical center 14 of the part of the core 3, made of a magnetostrictive material. This allows the linear dimensions of the core 3 to be changed as much as possible in the process of the mentioned rotation due to the alteration of the direction or magnitude of the magnetic flux in the core.

Figure 3:
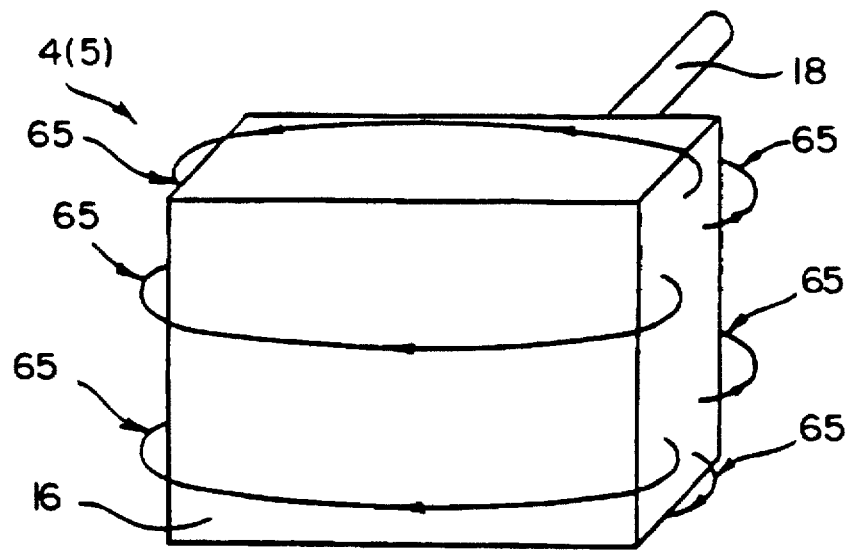
FIG. 3—axonometry of the main magnetic field source according to FIG. 1.
Figure 4:
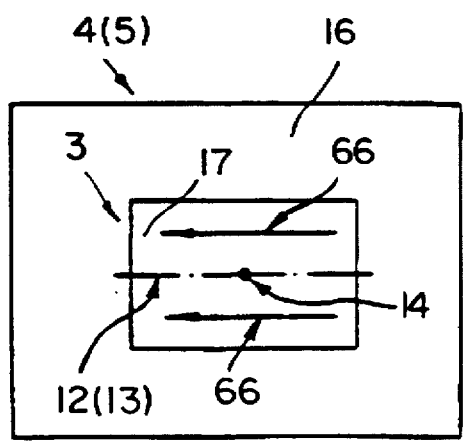
FIGS. 4 and 5—the diagram of control of the embodiment disclosed in FIG. 1 (the core is shown as if it rotates in relation to the stationary magnet system).
Figure 5:
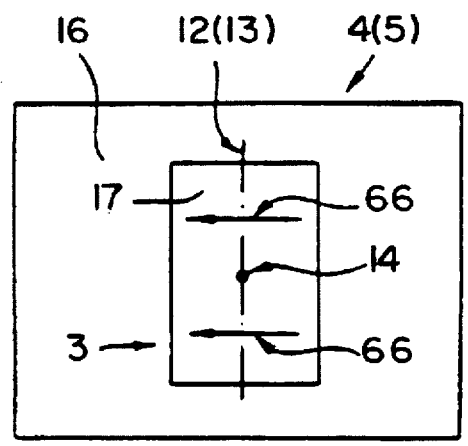

In the embodiment of the invention shown in FIG. 1 the main magnetic field source 4 of the magnet system 2 comprises one magnetic part 16 (shown in axonometry in FIG. 3). In this case the magnetic part 16 functions as the magnet system 2. The core 3 is implemented in the form of a single part 17, made of a magnetostrictive material. The magnet system 2 is mounted in the housing 1 on the axis 18 with the capability of rotation about the stationary core 3. The geometrical axis 15 of relative rotation of the magnet system 2 in this embodiment of the invention passes through the geometrical center 14 of the part 17 of the core 3, made of a magnetostrictive material, and is oriented at an angle, not equal to 0°, in relation to the vector of intensity of the magnetic field of magnet system 2 and to the geometrical axis 12 of symmetry of the part 17 of the core 3. The rotation is implemented with the help of the rotation drive 19, which can be represented e.g., by a step electric motor (during automatic control), or any known rotation drive of a mechanical type (during manual control). The axis 18 is mounted in the housing on the bearing 20.

The above-described embodiment of the invention has the magnet system 2 that comprises only one main magnetic field source 4, comprising a single magnetic part 16, and the core 3, that comprises a single part 17, made of a magnetostrictive material, and the geometrical center 14 of the magnetostrictive part 17 of the core 3, coinciding with the geometrical axis 15 of rotation of the magnet system 2.

This embodiment of the invention is given to illustrate the possibility of practical realization of the magneto-mechanical converter, in which the geometrical axis 15 of rotation of the magnet system 2 is oriented at an angle not equal to 0° towards the vector of intensity of the magnetic field of magnet system 2 and towards the geometrical axis 12 of symmetry of the part 17 of the core 3.

It is advisable to use the above-described embodiment of the invention in small-sized mechanisms for a single-coordinate displacement, e.g., in single-coordinate modules for precise positioning, or in single-coordinate vibrators of low capacity.

However, there are other possible embodiments of the invention.

Figure 6:
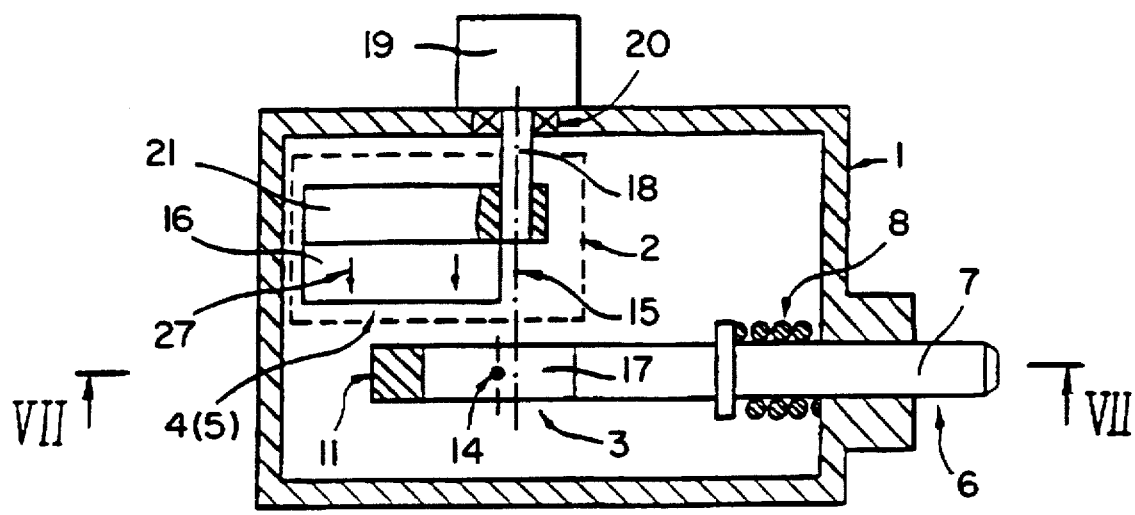
FIG. 6—depicts a general diagram of another embodiment of the present invention as shown in FIG. 1, in which the main magnetic field source is mounted on the magnetic circuit, and the geometrical center of the part of the core, made of a magnetostrictive material, is displaced in relation to the geometrical axis of relative rotation, oriented at an angle of 90° to the vector of intensity of the magnetic field of the magnet system and to the geometrical axis of the part of the core, made of a magnetostrictive material, and located in the designed position.
Figure 7:
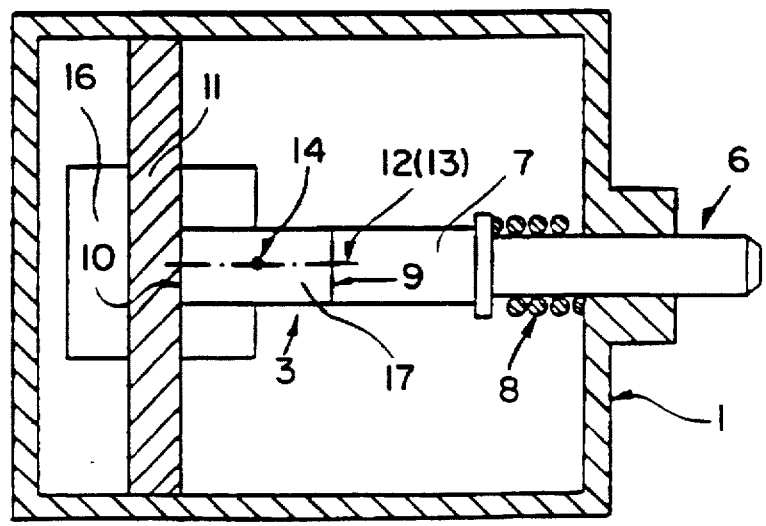
FIG. 7—section along the line VII—VII of FIG. 6.
Figure 8:
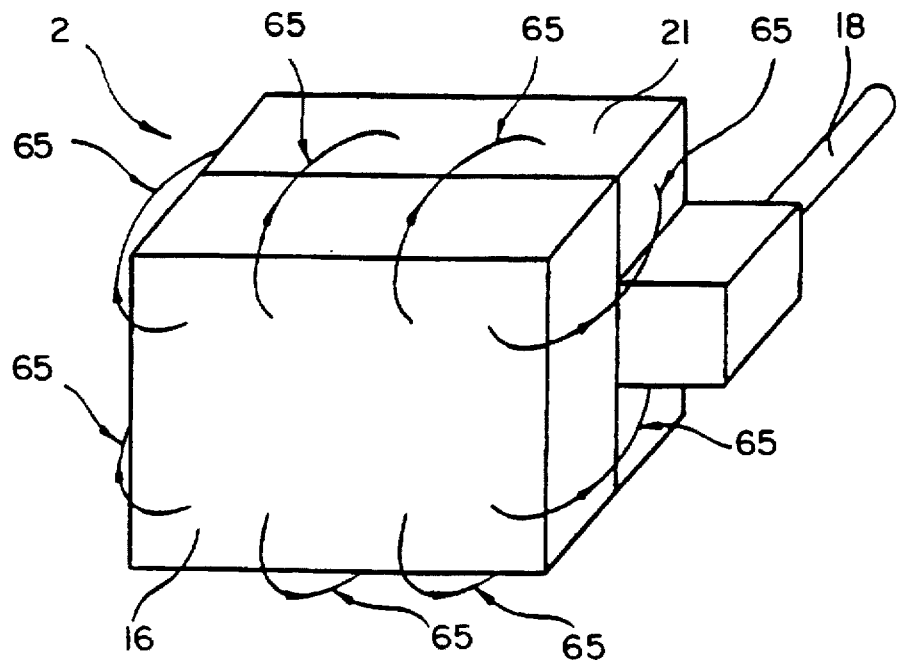
FIG. 8—axonometry of the main magnetic field source with the magnetic circuit shown in FIG. 7.
Figure 9:
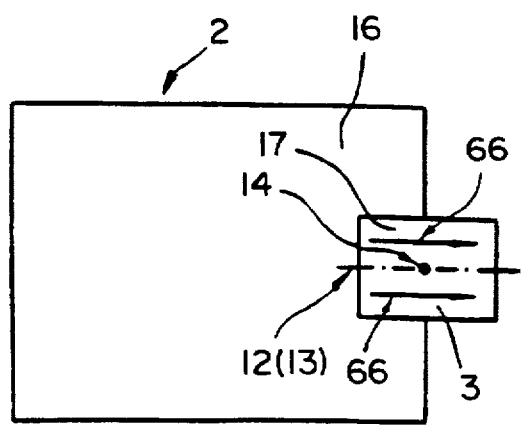
FIGS. 9 and 10—diagram of control of the embodiment of the magneto-mechanical converter shown in FIG. 6 (the core is shown as if it rotates in relation to the stationary magnet system).
Figure 10:
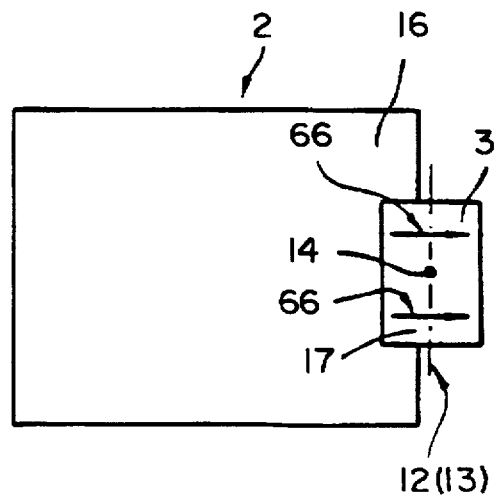

In the further embodiment shown in FIG. 6 the magneto-mechanical converter is basically similar to the previous one (FIG. 1), but differs from it by the fact that the geometrical center 14 of the part 17 of the core 3, made of a magnetostrictive material, is not coincident with the axis 15 of relative rotation of the magnet system 2. The axis 15 of the relative rotation of the magnet system 2 is oriented at an angle, equal to 90°, towards the vector of intensity of the magnetic field of magnet system 2 and towards the geometrical axis 12 of symmetry of the part 17 of the core 3. Furthermore, the main magnetic field source 4 is mounted on the magnetic circuit 21 of the magnet system 2 on the side facing the core 3.

It is advisable to use this embodiment as well as the previous one, in small-sized mechanisms for a single-coordinate displacement, e.g., in single-coordinate modules for precise positioning or in single-coordinate vibrators of low capacity.

Figure 11:
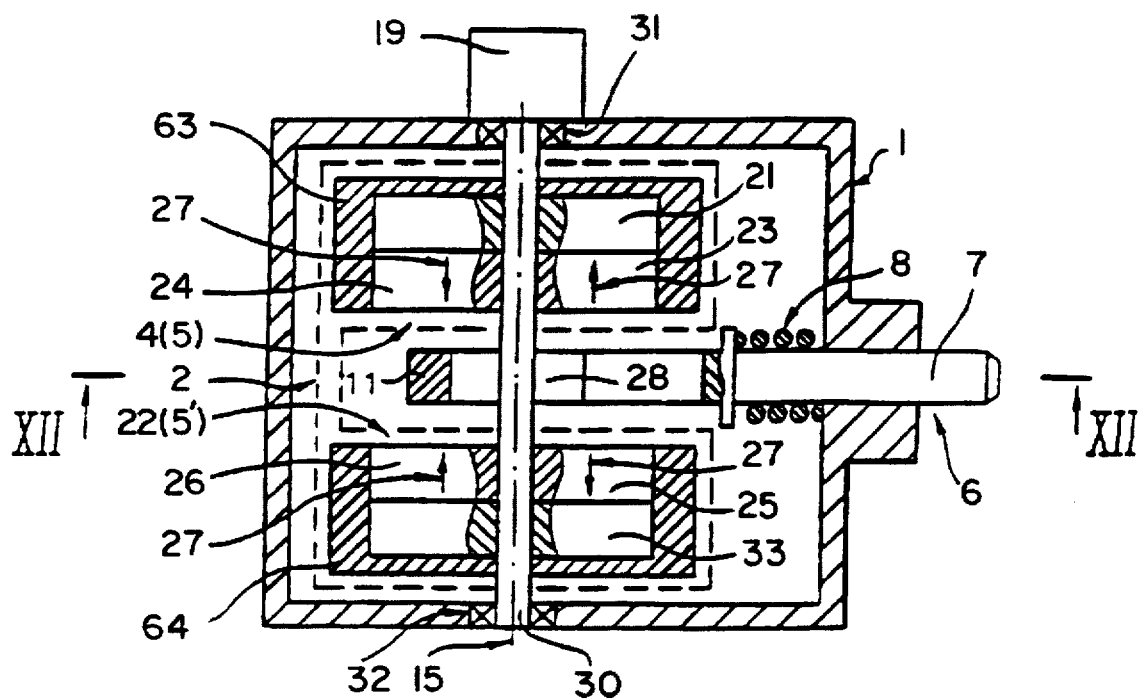
FIG. 11—depicts a general diagram of the embodiment of the present invention shown in FIG. 6, in which the magnet system is supplied with an auxiliary magnetic field source, mounted on an auxiliary magnetic circuit, where each source of the magnetic field comprises two magnetic parts, and the core comprises two parallel parts, made of a magnetostrictive material, located centrally-symmetrically in relation to the axis of rotation of the magnet system.
Figure 12:
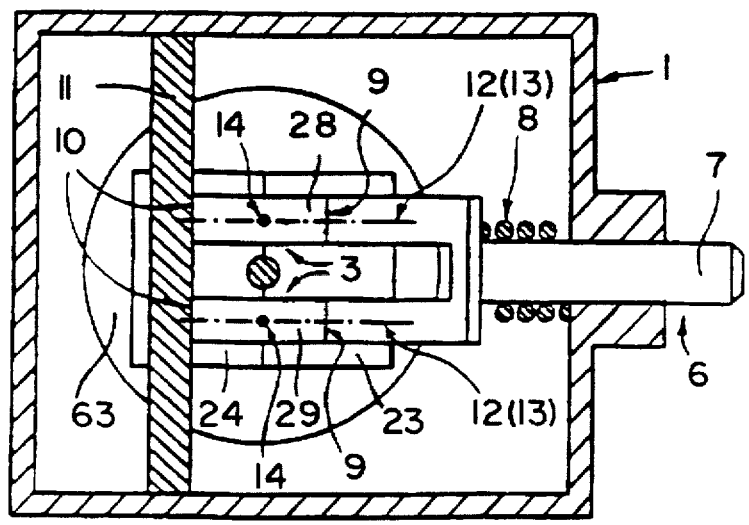
FIG. 12—section along the line XII—XII of FIG. 11.
Figure 13:
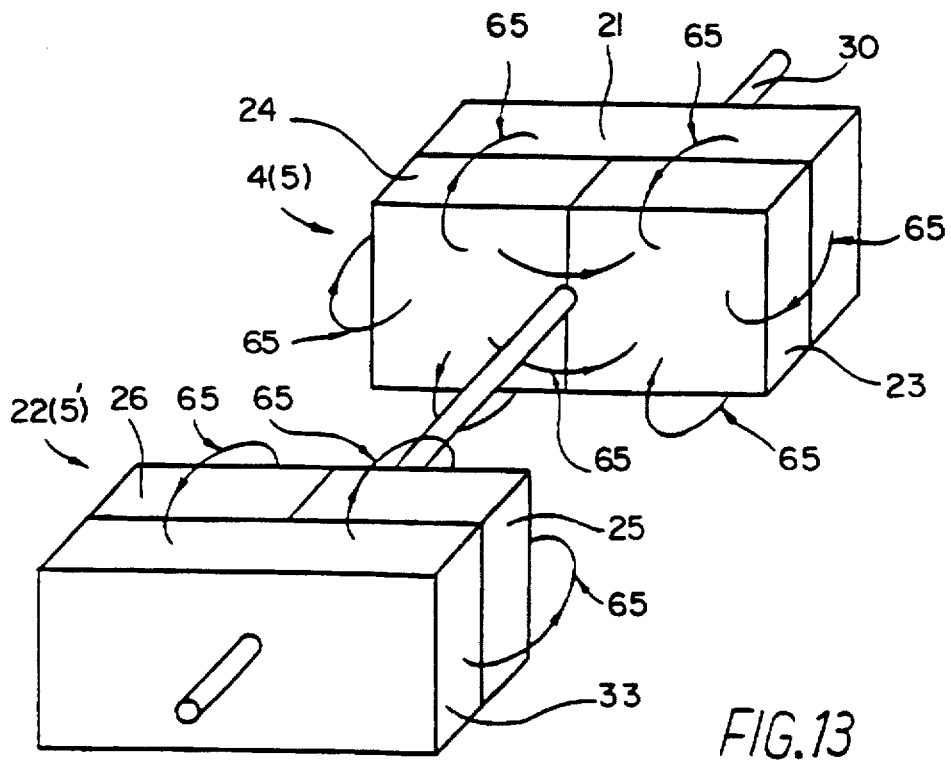
FIG. 13—axonometry of the main and auxiliary magnetic field sources with magnetic circuits shown in FIG. 11.
Figure 14:
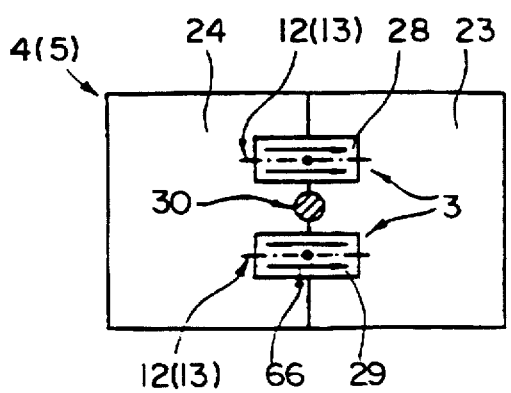
FIGS. 14 and 15—diagram of control of the embodiment shown in FIG. 11 (the core is shown as if it rotates in relation to the stationary magnet system).
Figure 15:
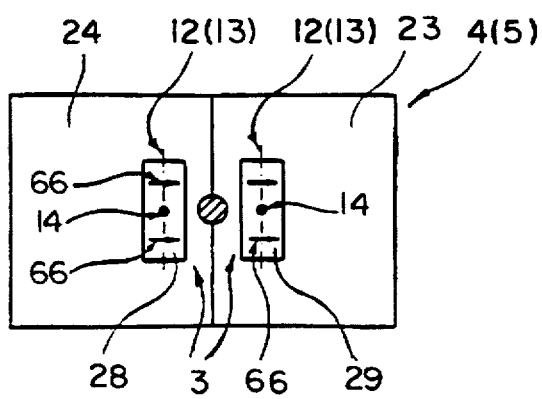

The embodiment of the invention shown in FIG. 11 is basically similar to the previous one of FIG. 6, but differs from it by the fact that the magnet system 2 comprises an auxiliary magnetic field source 22 implemented as a permanent magnet 5'. The main and auxiliary sources 4 and 22, respectively, of the magnetic field of the magnet system 2 are positioned mirror-symmetrically in relation to the plane, located perpendicularly towards the geometrical axis 15 of relative rotation of the magnet system 2 and passing through the geometrical axes 12 of symmetry of the magnetostrictive parts 28, 29. The auxiliary source 22 is mounted with the minimal permissible technological gap between it and the core 3.

Due to the availability of the mentioned technological gap, free rotation of the auxiliary source 22 of the magnetic field is ensured (i.e., without any friction on the corresponding surface of the core 3). Each of the sources 4 and 22 of the magnetic field comprises two magnetic parts 23, 24 and 25, 26, respectively, located in the same plane and forming groups (the first group—parts 23, 24, and the second group parts 25, 26). The magnetic parts 23, 24 and 25, 26, respectively, in each group formed by them, are located in such a way that the vectors 27 of magnetization of adjacent magnetic parts 23, 24 and 25, 26 are oriented, in the groups formed by them, in opposite directions. The groups of magnetic parts 23, 24 and 25, 26 are oriented relative to each other in such a way that in the designed position the vectors 27 of magnetization of the oppositely positioned parts 23 and 25, 24 and 26 are also oriented in opposite directions along the geometrical axis 15 of relative rotation of the core 3 and the magnet system 2.

The core 3 is implemented of two identical parts 28 and 29 that have the same magnetostriction sign and magnitude and positioned in parallel. The rotation of the magnet system 2 is realized on the axis 30, mounted in the housing 1 on the bearings 31, 32. The auxiliary source 22 of the magnetic field is mounted on the magnetic circuit 33 similar to the main source 4 of the magnetic field.

It is advisable to use this embodiment in the mechanisms for a single-coordinate displacement, e.g., in the single-coordinate modules for precise positioning, or in single-coordinate vibrators.

Figure 16:
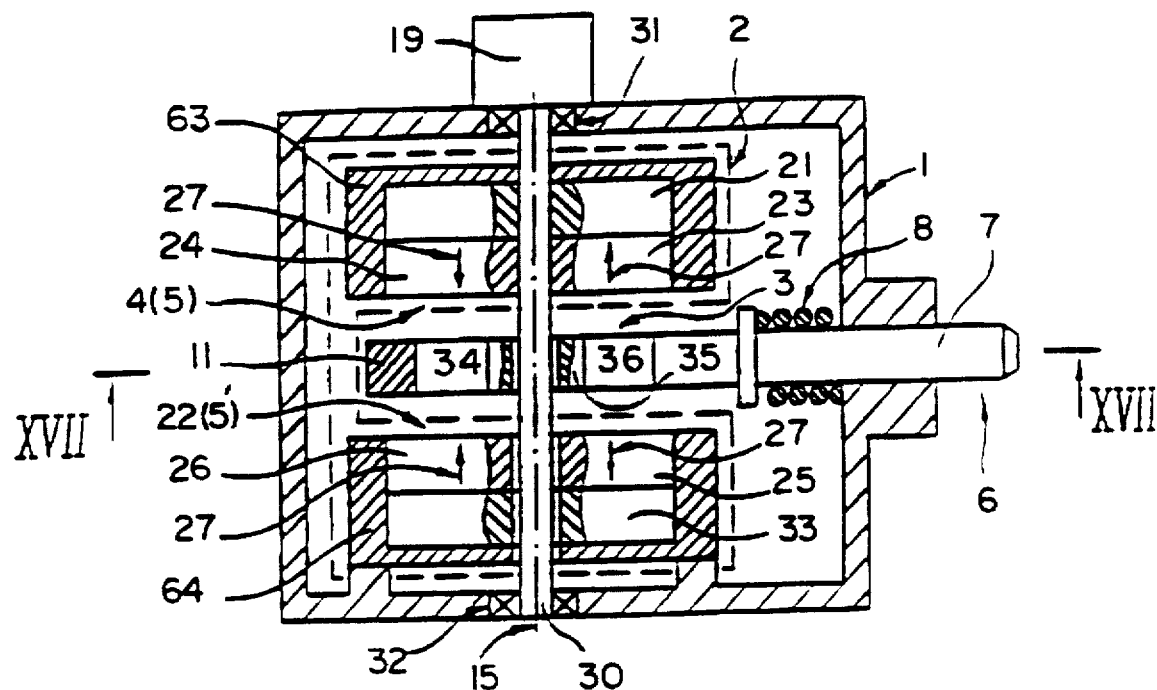
FIG. 16—depicts a general diagram of the embodiment of the present invention shown in FIG. 11, in which the core comprises three consecutively positioned parts, the outer ones of which are made of a magnetostrictive material, e.g., with a positive magnetostriction, the main and auxiliary magnetic field sources are mounted with the capability of relative rotation, and the axis of rotation of the magnet system passes through the middle part of the core.
Figure 17:
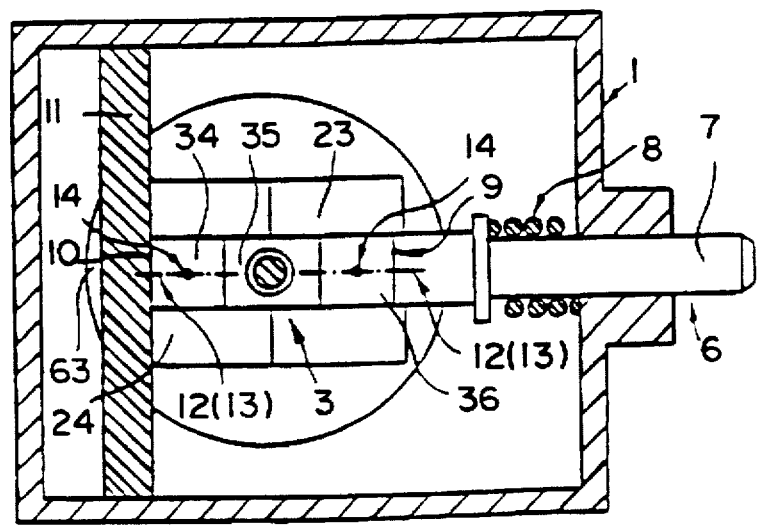
FIG. 17—section along the line XVII—XVII of FIG. 16.
Figure 18:
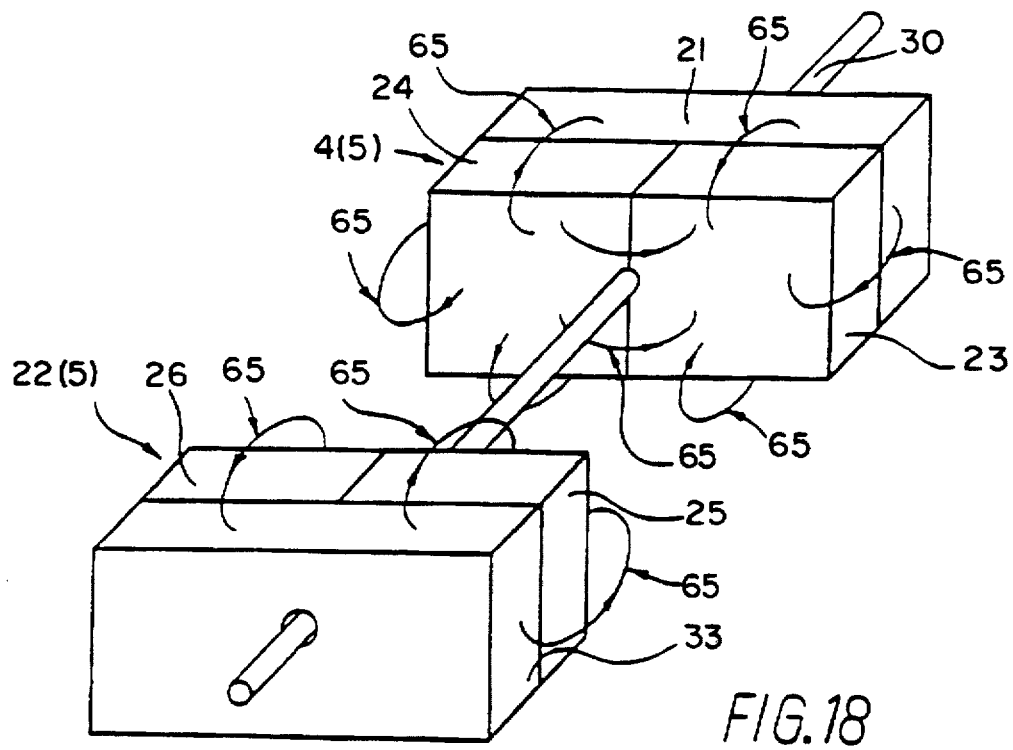
FIG. 18—axonometry of the magnet system shown in FIG. 16.
Figures 19, 20:
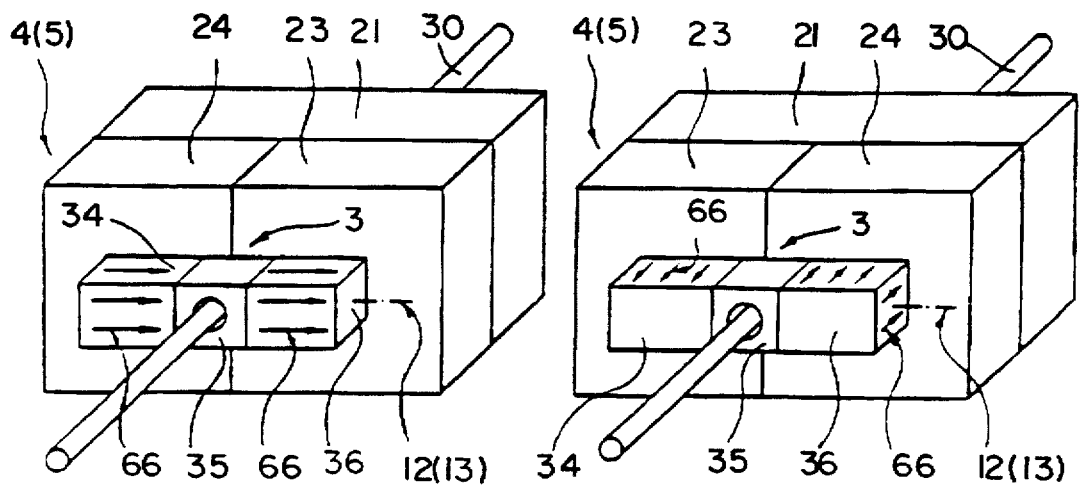
FIGS. 19 and 20—diagram of control of the embodiment of the invention shown in FIG. 16 (the rotation of the main magnetic field source relative to the core and auxiliary magnetic field source is shown).

In the embodiment of FIG. 16 the magneto-mechanical converter is basically similar to the previous embodiment shown in FIG. 11, but differs from it by the fact that the core 3 comprises three parts 34, 35, 36, which are consecutively positioned along the geometrical axis 12 of symmetry of parts 34, 36 of the core, made of a magnetostrictive material, oriented along the direction of displacement of the pusher 7. The parts 34, 36 of the core 3 are outer parts. The middle part 35 of the core 3 is made of a material with a modulus and an elastic limit that are at least no less in magnitude than the modulus and elastic limit of any of its adjacent outer parts 34, 36 of the core 3, respectively. For example, part 35 of the core 3 can be made of 12X18H9T stainless steel or BT9 titanium alloy. Both outer parts 34 and 36 of the core 3 are made of materials with magnetostriction of the same sign (both positive, or both negative) (e.g., of an alloy TbFe$_2$). The auxiliary source 22 and the main source 4 of the magnetic field are mounted on the axis 30 with the capability of relative rotation.

It is advisable to use this embodiment in the mechanisms for a single-coordinate displacement, e.g., in the single-coordinate modules for precise positioning.

Figure 21:
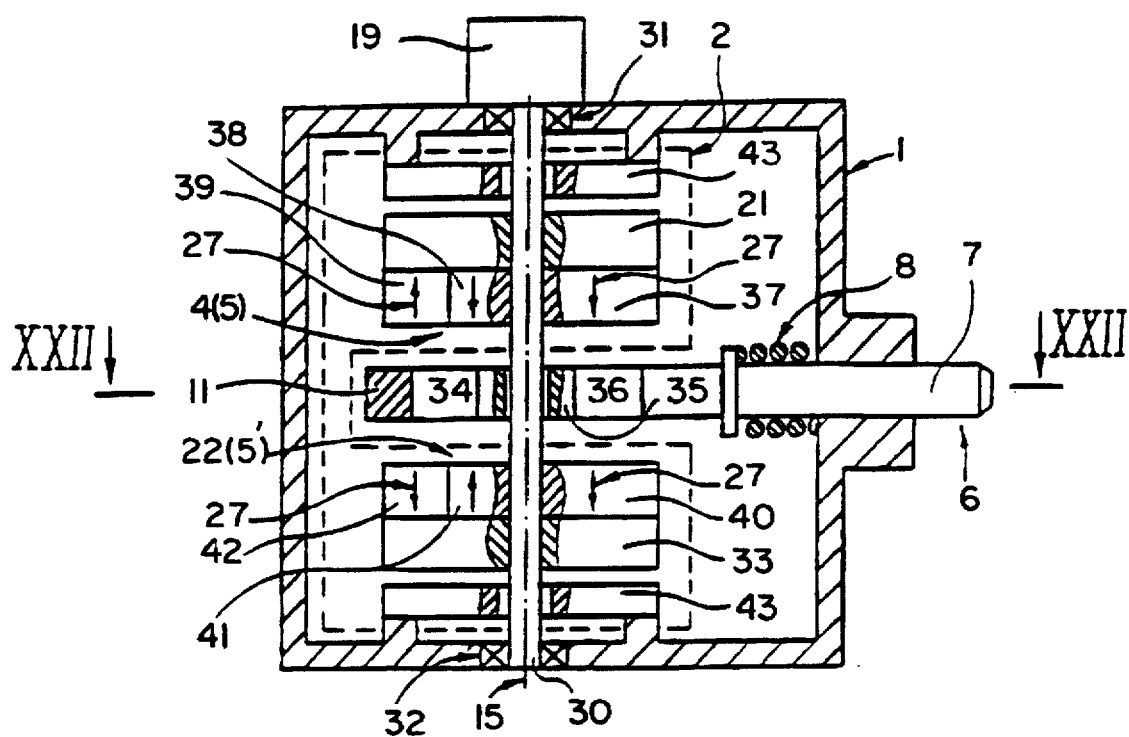
FIG. 21—depicts a general diagram of the embodiment of the invention shown in FIG. 16, wherein the magnet system is provided with a closing magnetic circuit, the main and auxiliary magnetic field sources comprise three parts (each of them), and outer parts of the core are made of materials with a magnetostriction of a different sign.
Figure 22:
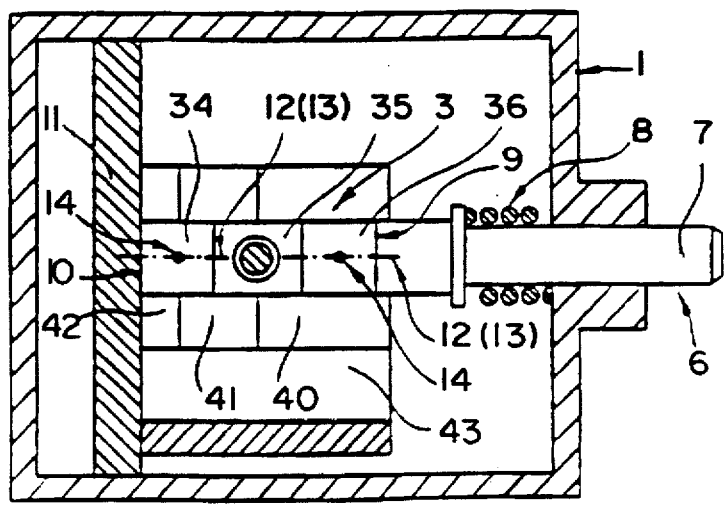
FIG. 22—section along the line XXII—XXII of FIG. 21.
Figure 23:
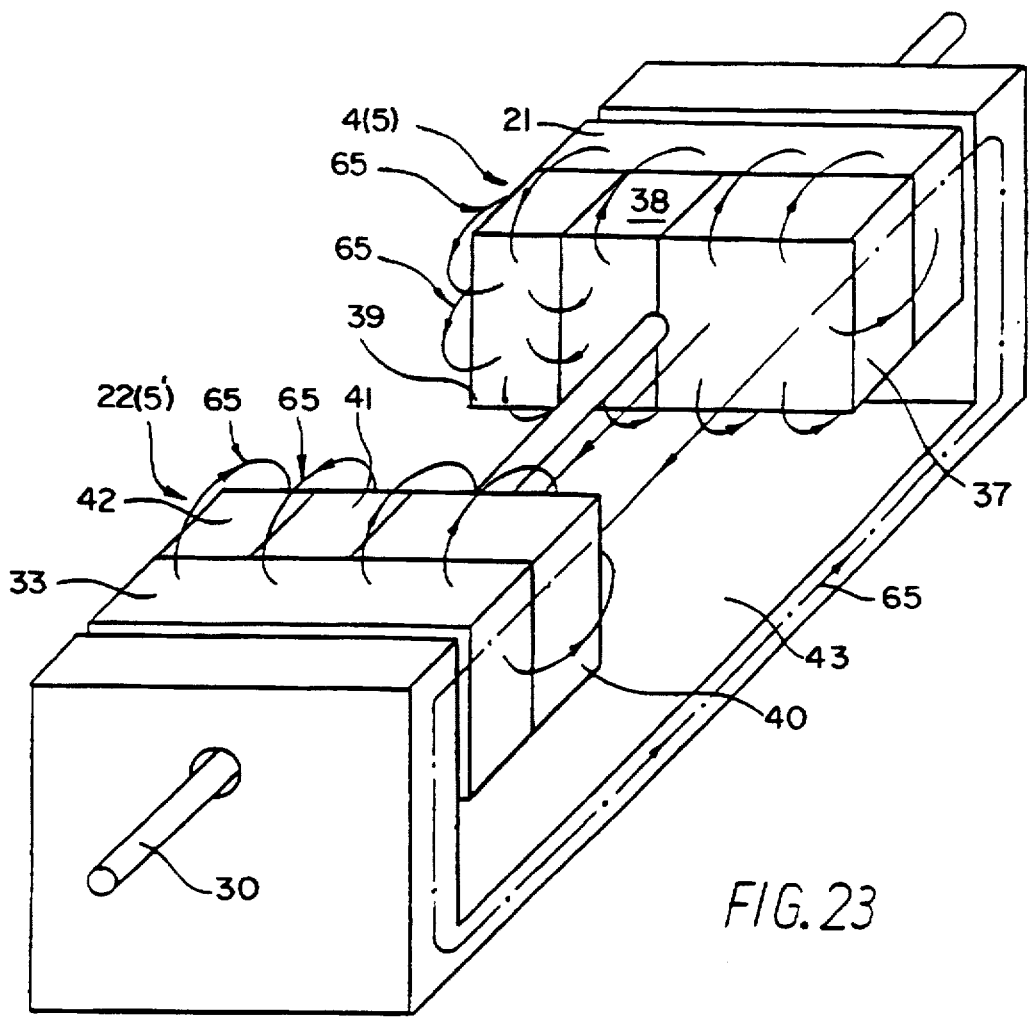
FIG. 23—axonometry of the magnet system shown in FIG. 21.
Figures 24, 25:
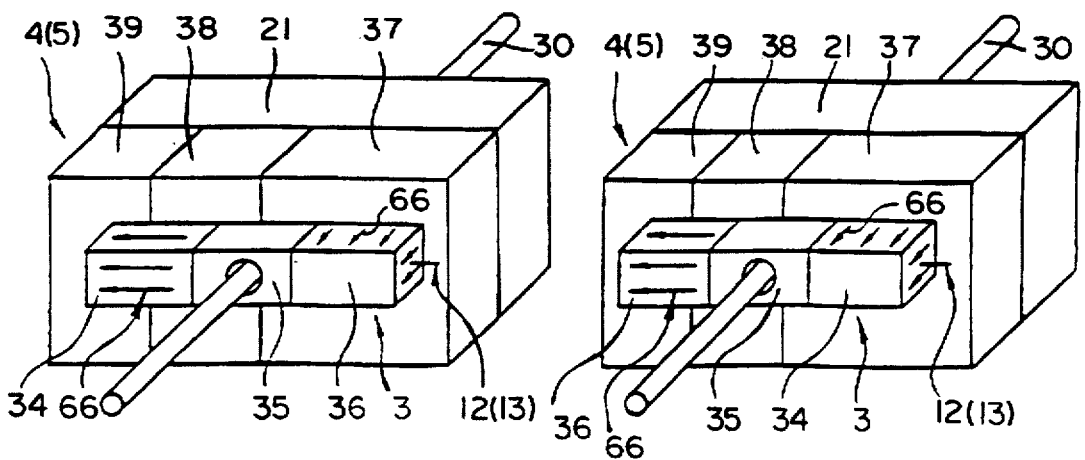
FIGS. 24 and 25—diagram of control of the embodiment shown in FIG. 21 (the core is shown as if it rotates in relation to the stationary magnet system).

In the embodiment shown in FIG. 21 the magneto-mechanical converter is basically similar to the previous embodiment shown in FIG. 16, but differs from it by the fact that the main and auxiliary magnetic field sources 4 and 22, respectively, each comprises three magnetic parts 37, 38, 39 and 40, 41, 42, respectively, that form groups located in the same plane. One outer part 34 of the core 3 is made of a material with a positive magnetostriction (e.g., of an alloy TbFe$_2$). The other outer part 36 of the core is made of a material with a negative magnetostriction (e.g., of a SmFe$_2$ alloy). In addition to this, the magnet system 2 is provided with a closing magnetic circuit 43, and the main and auxiliary sources 4, 22 of the magnetic field are fixed firmly on the axis 30.

It is advisable to use this embodiment, like the previous one depicted in FIG. 16, in mechanisms for a single-coordinate displacement, e.g., in single-coordinate modules for precise positioning.

Figure 26:
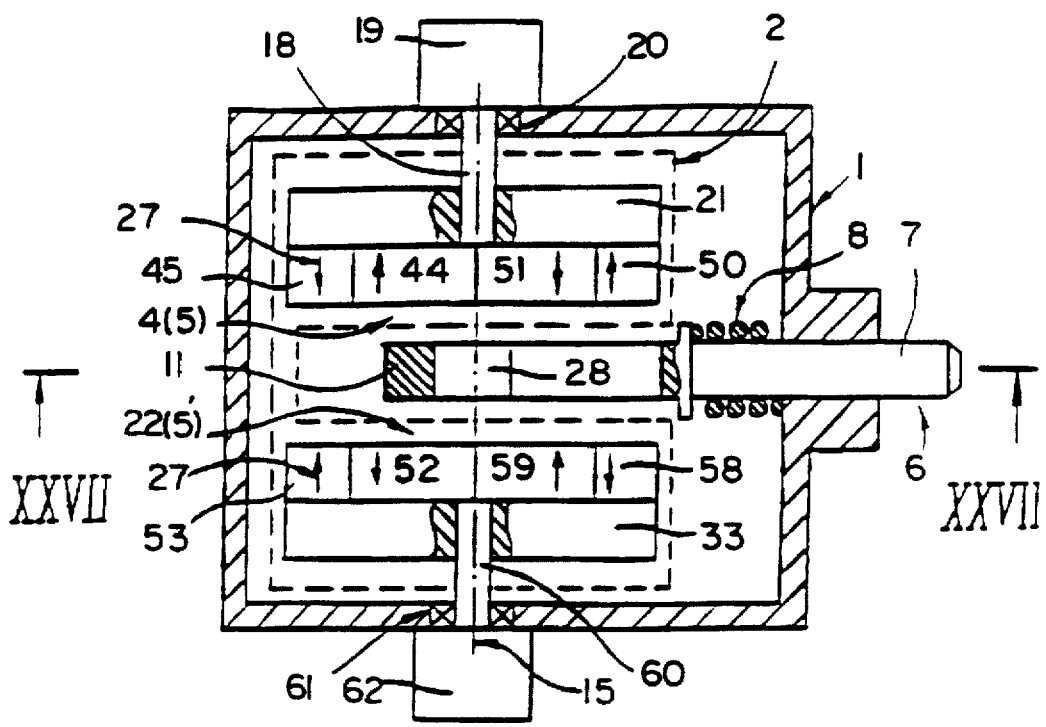
FIG. 26—depicts another general diagram of the embodiment of the magneto-mechanical converter shown in FIG. 11, in which the main and auxiliary magnetic field sources are both implemented in the form of disks, and magnetic parts are implemented in the form of sectors.
Figure 27:
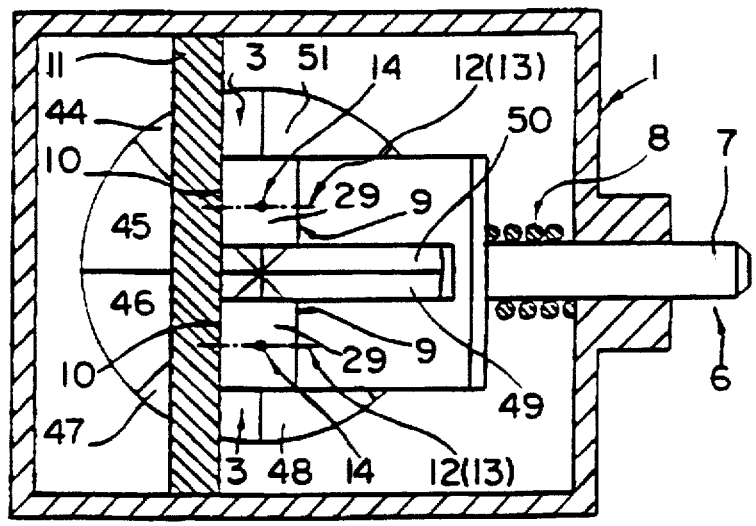
FIG. 27—section along the line XXVII—XXVII of FIG. 26.
Figure 28:
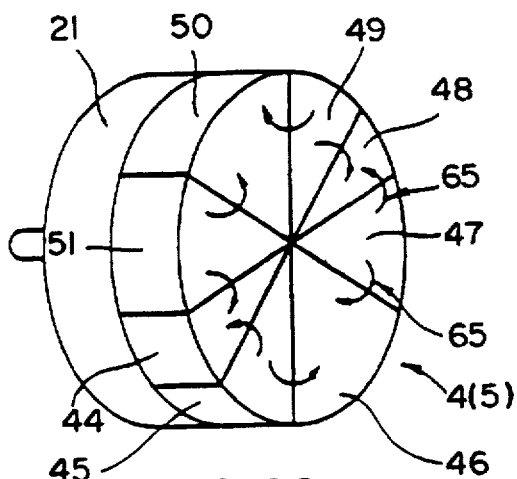
FIG. 28 and 29—depicts the magnet system shown in FIG. 26 in perspective with regard for the mutual location of the magnetic parts of the main and auxiliary (respectively) magnetic field sources in the designed position.
Figure 29:
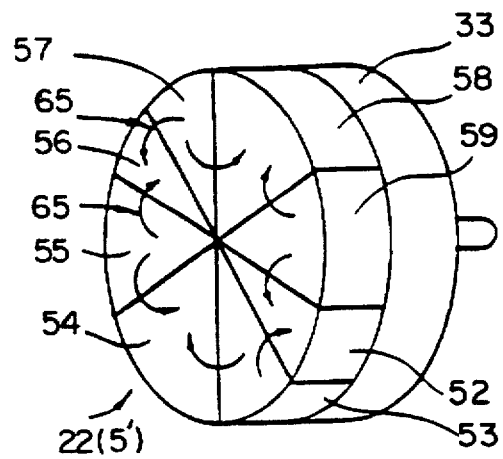

In the embodiment shown in FIG. 26 the magneto-mechanical converter is basically similar to the embodiment of FIG. 11, but differs from it by the fact that the main and auxiliary sources 4 and 22, respectively, of the magnetic field are made in the form of disks, and the magnetic parts 44, 45, 46, 47, 48, 49, 50, 51 and 52, 53, 54, 55, 56, 57, 58, 59, in groups forming the disks, respectively, of the main and auxiliary sources 4 and 22 of the magnetic field are implemented in the form of sectors. The auxiliary source 22 of the magnetic field is mounted with the capability of rotation in the housing 1 on the axis 60 by means of a bearing 61 and is rotated by an individual drive 62 of the rotative movement.

It is advisable to use this embodiment in single-coordinate vibrators of high capacity, as it allows one to obtain high power of mechanical vibrations of the pusher 7 (as compared to the previously described embodiments) while preserving the frequency of rotation of the sources 4 and 22 of the magnetic field of magnet system 2.

In all the above-described embodiments the sources 4 and 22 of the magnetic field can be mounted in the cases 63 and 64, respectively, made of a non- magnetic material, and the axis 13 of the easiest direction of magnetization of the material of magnetostrictive parts 17, 28, 29, 34, 36 of the core 3 coincides in direction with the geometrical axis 12 of symmetry of mentioned parts 17, 28, 29, 34, 36 of the core 3, passing along the direction of displacement of the pusher 7.

In FIG. 3, 8, 13, 23, 28 and 29, arrows indicate lines of forces 65 of the magnetic induction of the magnet system 2, and in FIGS. 4 and 5, 9 and 10, 14 and 15, 19 and 20, 24 and 25, 30 and 31, arrows indicate the vectors 66 of magnetization of the material of magnetostrictive parts 17, 28, 29, 34, 36 of the core 3.

Figure 32:
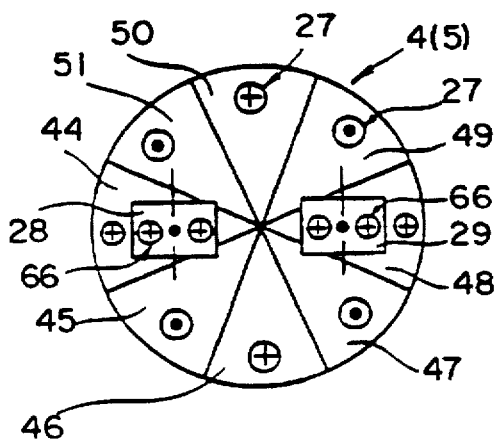
Figure 33:
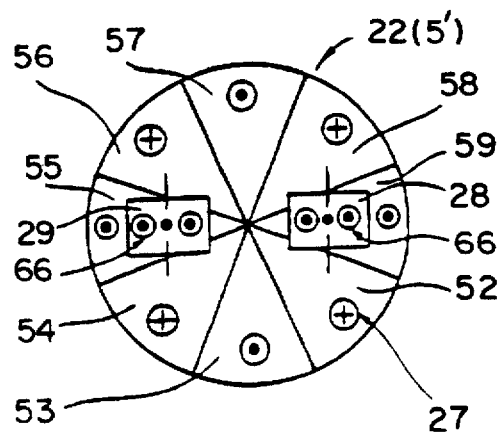

The vectors 66 of magnetization of the material of magnetostrictive parts 28 and 29 of the core 3 in FIG. 32 and FIG. 33, as well as the vectors 27 of magnetization of magnetic parts 44, 45, 46, 47, 48, 49, 50, 51 and 52, 53, 54, 55, 56, 57, 58, 59 (in FIG. 30, 31, 32, 33) are shown in the form of circles with dots and crosses in the center.

The general principle of operation of the magneto-mechanical converter according to the present invention is realized in the following way. The position of maxima of intensity of the magnetic field in the working zone (zone of location of the core 3) of the magnet system 2 are defined preliminary on the basis of experiments or simulation. In the designed (initial) position the geometrical center 14 of at least one part 17, 28, 29, 34, 36 of the core 3, made of a magnetostrictive material, is placed in one of the maxima of intensity of the magnetic field of magnet system 2. Further, in order to realize the displacement of the actuator 6, relative rotation of the core 3 and the magnet system 2 is implemented, thus providing alteration of magnitude and/or direction of the vector of intensity of the magnetic field of magnet system 2 in the geometrical center 14 of at least one part 17, 28, 29, 34, 36 of the core 3, made of a magnetostrictive material.

The magneto-mechanical converter in the particular embodiments of the invention (FIG. 1, 6, 11, 16, 21, 26) operates in the following way. When engaging the drive 19 of rotative movement (FIG. 1, 6, 11, 16, 21, 26) and the auxiliary drive 62 (FIG. 26), the rotation of the axis 18 (FIG. 1, 6, 26), axis 30 (FIG. 11, 16, 21), and axis 60 (FIG. 26) together with the corresponding magnet system 2 mounted on them takes place. For example, in the designed (initial) position of the magnet system 2 the intensity of the magnetic field of this system is oriented along the axis of the easiest direction of magnetization of the material of the magnetostrictive parts 17, 28, 29, 34 of the core 3 with a positive magnetostriction, along the axis of the easiest direction of magnetization of the magnetostrictive part 36 material with a positive magnetostriction (FIG. 19, 20), and across the axis of the easiest direction of magnetization of the magnetostrictive part 36 material with a negative magnetostriction (FIG. 24, 25) of the core 3. With the rotation of the magnet system 2 the direction of intensity of the magnetic field in each magnetostrictive part 17, 28, 29, 34, 36 of the core 3 alters, and in a certain position of the magnet system 2 it changes by 90° in relation to the vector of intensity of the magnetic field of this system 2 in the designed position of the core 3. This causes the maximum change of the length of the core 3 and, respectively, the maximum displacement of the pusher 7.

The axis 13 of the easiest direction of magnetization of the material of magnetostrictive parts 17, 28, 29, 34, 36 of the core 3 in the embodiments of the invention (FIG. 1, 6, 11, 16, 21, 26), as indicated above, is coincident with the geometrical axis 12 of symmetry of the mentioned parts 17, 28, 29, 34, 36, which (axis 12) passes along the direction of displacement of the actuator 6, made as a pusher 7.

In the embodiments of the invention shown in FIGS. 1, 6, 11, the direction of the vector of intensity of the magnetic field in each magnetostrictive part 17, 28, 29 of the core 3 changes by 90° at the relative rotation of the magnet system 2 and the core 3 by 90°, as is represented in the diagrams of control, shown in FIGS. 4 and 5, 9 and 10, 14 and 15 respectively. That is, in FIGS. 4, 9, 14 magnetostrictive parts 17, 28, 29 are located in the designed (initial) position, that corresponds to the maximum of intensity of the longitudinal magnetic field of the magnet system 2 relative to the axis 13 of the easiest direction of magnetization and to the axis 12 of symmetry of the mentioned parts 17, 28, 29 of the core 3, and in FIGS. 5, 10, 15, respectively, in the position, corresponding to the maximum of intensity of transversal magnetic field of magnet system 2 relative to the same axes 12, 13 of the magnetostrictive parts 17, 28, 29 of the core 3.

Thus, in these embodiments of the invention (FIGS. 1, 6, 11) at one complete revolution of the magnet system 2 (i.e., its revolution by 360°) the core 3 is able to make maximum changes of its linear dimension in the direction corresponding to the direction of the displacement of the pusher 7 four times.

In the embodiments of the invention shown in FIGS. 16 and 21 the direction of the vector of intensity of the magnetic field in each magnetostrictive part 34, 36 of the core 3 changes by 90° at the relative rotation of the magnet system 2 (FIG. 21) or the main source 4 (FIG. 16) of the magnetic field (with the stationary auxiliary source 22 of the magnetic field) and the core 3 by 180°. It is represented in the diagrams of control shown in FIGS. 19 and 20, 24 and 25, respectively. That is, in FIGS. 19 and 24 the magnetostrictive parts 34 and 36 are located in the designed (initial) position, corresponding to the maximum of intensity of the longitudinal magnetic field (FIG. 19) and to the maxima of intensity of the longitudinal magnetic field (for part 34 with a positive magnetostriction) and transversal magnetic field (for part 36 with a negative magnetostriction) of the magnet system 2 (FIG. 24) relative to the axis 13 of the easiest direction of magnetization and the axis 12 of symmetry of the mentioned parts 34 and 36 of the core 3, and in FIGS. 20 and 25, respectively, in the position, corresponding to the maximum of intensity of the transversal magnetic field FIG. 20) and to the maxima of intensity of the transversal (for part 34 with a positive magnetostriction) and longitudinal (for part 36 with a negative magnetostriction) magnetic field of the magnet system 2 (FIG. 25) relative to the same axes 12, 13 of the magnetostrictive parts 34, 36 of the core 3.

Thus, in these embodiments of the invention (FIGS. 16 and 21) at one complete revolution of the magnet system 2 (i.e., its revolution by 360°) the core 3 is able to make maximum changes of its linear dimension in the direction corresponding to the direction of the displacement of the pusher 7 two times.

In the embodiment shown in FIG. 26 the direction of the vector of intensity of the magnetic field in each of the magnetostrictive part 28 , 29 of the core 3 changes by 90° at the rotation, e.g., in opposite directions with the same angular frequency of the main source 4 and the auxiliary source 22 of the magnetic field of magnet system 2 (FIG. 28, 29) by an angle, equal to one-sixteenth (¹/₁₆) part of 360°, relative to the core 3. It is represented in the diagram of control shown in FIGS. 30, 31 and FIGS. 32, 33.

Figure 30:
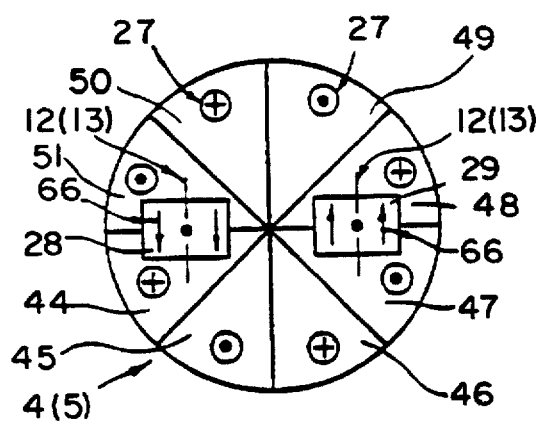
FIGS. 30 and 31, FIGS. 32 and 33—diagrams of control of the embodiment of the invention shown in FIG. 26, i.e., projections of the parts of the core on the main and auxiliary magnetic field sources are shown in the designed position of the core (FIGS. 30 and 31) and after rotation of the mentioned sources in opposite directions (FIGS. 32 and 33) at the same angle (the vectors of magnetization of the magnetic parts of the main and auxiliary magnetic field sources and of the core are shown by circles with dots and crosses in the center).
Figure 31:
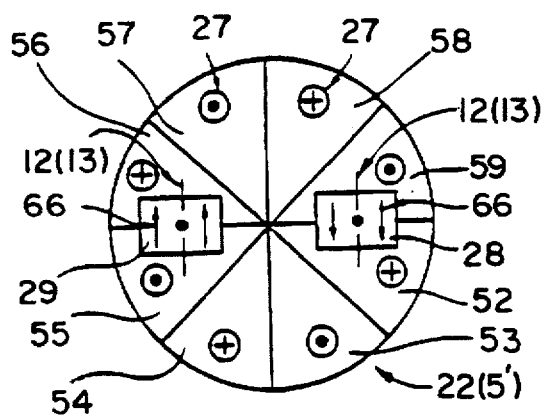

That is, in FIGS. 30 and 31 the magnetostrictive parts 28, 29 are located in the designed (initial) position, corresponding to the maximum of intensity of the longitudinal magnetic field of magnet system 2 relative to the axes 13 of the easiest direction of magnetization and axes 12 of symmetry of the mentioned parts 28, 29 of the core 3, and in FIGS. 32 and 33—in the position, corresponding to the maximum of intensity of the transversal magnetic field relative to the same axes 12, 13 of the magnetostrictive parts of the core 3.

Thus, in this embodiment (FIG. 26), when the rotation in opposite directions with the same angular frequency of the main and auxiliary sources 4 and 22 of the magnetic field of the magnet system 2 is performed, the magnetostrictive parts 28 and 29 of the core 3 are able to make maximum changes of their linear dimensions in the direction corresponding to the direction of the displacement of the pusher 7 sixteen times at a complete revolution by 360° of each of the sources 4 and 22 of the magnetic field.

Practical realization of the present invention has been implemented in accordance with the embodiment of FIG. 11. The main and auxiliary sources 4, 22 of the magnetic field were made of a Nd—Fe—B type material, the main and auxiliary magnetic circuits 21, 33—of steel 3, the core 3 comprised two parts 28, 29 implemented in the form of a parallelepiped of the TbFe$_2$ material. The overall dimensions of each magnet system are as follows: diameter 60 mm, height 51 mm. The overall dimensions of each magnetic circuit 21 and 33 are as follows: diameter 60 mm, height 10 mm. The overall dimensions of each of the magnetic parts 23, 24, 25, 26 of the sources 4 and 22 of the magnetic field are as follows: 30 mm×20 mm×10 mm. The overall dimensions of each of the two parts 28, 29 of the core 3 are as follows: length 20 mm, width 4 mm, height 8 mm. The gap between the core 3 and each of the sources 4 and 22 of the magnetic field is 1.5 mm, and between the parts 28, 29 of the core 3 and the axis 30 of rotation of the magnet system 2 is 1 mm. The magnitude of intensity of the magnetic field in the geometrical center of the composed core was equal to 360 kA/m. The power of the motor, that rotates the magnet system 2 while positioning was equal to 5 W. The relative rotation of the core 3 and the magnet system 2 was implemented according to the diagram of FIGS. 14 and 15 (the core is shown as if it rotates in relation to the stationary magnet system). The longitudinal axis of the core 3 coincided in direction with the axis 13 of the easiest direction of magnetization of the material of magnetostrictive parts 28, 29 of the core 3 and with the direction of the vector of intensity of the magnetic field in the geometrical centers 14 of the parts 28, 29 at the designed position of the magnet system 2 and the core 3.

The actuator 6 traveled a distance of 30 µm. Thus, in the magneto-mechanical converter of the invention according to the embodiment of FIG. 11, change of the coordinate of the pusher 7 at 30 µm is provided with the power consumption of 5 W (power of the motor, that rotates the magnet system), while maintaining this coordinate during any period of time requires no power at all.

In the prior art device the similar change of the coordinate of the pusher (30 µm ) required the power of 700 W , and in the process of maintaining this coordinate the power consumed by the system was also 700 W.

While using the above-described magneto-mechanical converter as a vibrator the amplitude of vibrations of the pusher was 15 µm, frequency 400 Hz, and the electric power consumed by the motor was 90 W.

Industrial Application

The magneto-mechanical converter can be used in the means of automation as a device for adjustable displacements of objects, primarily for the precise positioning of actuators of machines and mechanisms, and namely in precision manipulators, in adaptive optics, for controlling laser beam movement in processing centers, for displacement of the working tool in machines, displacement of the knife of microtome, turn of a sample in precise crystallographic x-ray devices, displacement of the needle in tunnel microscopes, displacement of the object table in tunnel and electron microscopes, in precise metering devices, in valves for regulating dispense of gaseous and liquid chemical reagents, in preparing templates of hybrid microcircuits, in valves of hydraulic and pneumatic systems, etc. In addition to this, the magneto-mechanical converter can be used in different devices working in the mode of vibrations, e.g., in metal-working machines for strengthening the surfaces of machine parts by riveting or burnishing, for facilitating the processes of drilling or cutting, in vibropumps, in manual construction tools for piercing concrete and rocks, in technological equipment, e.g., in vibromachines for making construction concrete blocks, in technology of stimulating the output of the oil and gas wells, etc.

I claim:

1. A magneto-mechanical converter comprising:
 a housing;
 a magnet system mounted in said housing and comprising a main source of magnetic field;
 a core mounted in said housing and having linear dimensions, at least a portion of said core comprising a magnetostrictive material; and
 an actuator connected to said core and movable along a displacement direction relative to the housing; wherein:
 said main source of magnetic field is a permanent magnet;
 said magnet system is mounted in the housing for relative rotation about said core, the axis of said relative rotation being oriented such that the linear dimensions of the core change during relative rotation due to alteration of magnetic flux in the core.

2. The magneto-mechanical converter according to claim 1, wherein said at least a portion of said core comprising a magnetostrictive material has a geometric center.

3. The magneto-mechanical converter according to claim 2, wherein the core is located in a position selected such that the geometric center of said at least one portion comprising a magnetostrictive material is located in a zone of the magnet system which corresponds to a maximum of intensity of the magnetic field of said magnet system.

4. The magneto-mechanical converter according to claim 2, wherein the axis (15) of relative rotation of the magnet system about the core is oriented nonparallel in relation to at least one of: (a) a vector of intensity of the magnetic field of the magnet system at the geometric center of said at least one portion of the core that comprises a magnetostrictive material when the core is located in the selected position, and (b) a geometric axis of said at least one portion of the core that comprises a magnetostrictive material, said geometric axis being oriented along said displacement direction of the actuator and passing through the geometric center of said at least one portion comprising a magnetostrictive material.

5. The magneto-mechanical converter according to claim 3 or claim 4, wherein the axis of relative rotation of the magnet system about the core is located (a) perpendicular to a geometric axis of said at least one portion of the core that comprises a magnetostrictive material said geometric axis passing through the geometric center of said at least one portion along the displacement direction of the actuator, and (b) perpendicular to a vector of intensity of the magnetic field of the magnet system in the geometric center of said at least one portion of the core that comprises a magnetostrictive material when the core is in the selected position.

6. The magneto-mechanical converter according to claim 2 or claim 4, wherein the axis of relative rotation of the magnet system about the core passes through the geometric center of said at least one portion of the core that comprises a magnetostrictive material.

7. The magneto-mechanical converter according to claim 2, or claim 3, or claim 4, comprising a first permanent magnet serving as the main source of the magnetic field, said first permanent magnet comprising at least two main magnetic parts forming a group and positioned in one plane such that vectors of magnetization of at least two adjacent ones of said main magnetic parts are oriented in opposite directions.

8. The magneto-mechanical converter according to claim 7, wherein the magnet system comprises a second permanent magnet serving as an auxiliary source of the magnetic field, said second permanent magnet comprising at least two auxiliary magnetic parts forming a group and located in one plane such that vectors of magnetization of at least two adjacent ones of said auxiliary magnetic parts are oriented in opposite directions, wherein both said main source and said auxiliary source of the magnetic field are positioned mirror-symmetrically in relation to a plane perpendicular to the axis of relative rotation of the magnet system about the core, and groups of main and auxiliary magnetic parts (23, 24, 37, 38, 39, 25, 26, 40, 41, 42) are oriented in such a way that the vectors (27) of magnetization of oppositely positioned main and auxiliary magnetic parts of said main and auxiliary sources of the magnetic field are oriented in opposite directions along the axis of relative rotation of the magnet system about the core.

9. The magneto-mechanical converter according to claim 8, wherein the groups of magnetic parts serving as sources 1of the magnetic field are arranged in the form of disks, and each of the magnetic parts in the groups has the form of a sector.

10. The magneto-mechanical converter according to claim 7 wherein the core comprises three parts which are consecutively positioned along a geometric axis of at least one part that comprises a magnetostrictive material, said geometric axis passing through the geometric center of said at least one part along the displacement direction of the actuator, wherein outer parts of the core comprise a magnetostrictive material, and a middle part of the core comprises a material with elastic modulus and elastic limit that are at least as great, by magnitude, as the elastic modulus and elastic limit, respectively, of material of any of said outer parts adjacent to said middle part.

11. The magneto-mechanical converter according to claim 10, wherein the material of one outer part of the core has a positive magnetostriction, and the material of another outer part has a negative magnetostriction.

12. The magneto-mechanical converter according to claim 1, wherein the core comprises two identical parallel positioned parts comprising a magnetostrictive material, wherein said parallel positioned parts of the core are located centrally symmetrically in relation to the geometrical axis of relative rotation of the magnet system about the core.

13. The magneto-mechanical converter according to claim 1, or claim 3, or claim 4, wherein the magnet system is supplied with a magnetic circuit, and the source of the magnetic field is located on the magnetic circuit on the side of the magnetic circuit facing the core.

14. The magneto-mechanical converter according to claim 2, or claim 3, or claim 4, wherein an axis of easiest direction of magnetization of the material of said at least one portion comprising a magnetostrictive material passes through the geometric center of said at least one portion along the displacement direction of the actuator.

* * * * *